US005416971A

United States Patent [19]

Hegazi et al.

[11] Patent Number: 5,416,971

[45] Date of Patent: May 23, 1995

[54] METHOD OF ASSEMBLING A MONOLITHIC GALLIUM ARSENIDE PHASED ARRAY USING INTEGRATED GOLD POST INTERCONNECTS

[76] Inventors: Gamal M. Hegazi, 11513 Brundidge Ter., Germantown, Md. 20876; Krishna P. Pande, 12200 Galesville Dr., Gaithersburg, Md. 20878; Amin Ezzeddine, 6594 Dovecote Dr., Columbia, Md. 21044; Robert Sorbello, 8617 Red Coat Ln., Potomac, Md. 20854; Bernard Geller, 11102 Whisperwood La., Rockville, Md. 20852

[21] Appl. No.: 98,803

[22] Filed: Jul. 28, 1993

Related U.S. Application Data

[62] Division of Ser. No. 732,269, Jul. 18, 1991, Pat. No. 5,262,794.

[51] Int. Cl.$^{6}$ .............................................. H05K 3/34

[52] U.S. Cl. ................................ 29/840; 228/262.61; 343/770

[58] Field of Search .......................... 29/825; 257/738; 343/770

[56] References Cited

U.S. PATENT DOCUMENTS

| | | | |
|---|---|---|---|
| Re. 32,369 | 3/1987 | Stockton et al. . | |
| 3,811,128 | 5/1974 | Munson . | |
| 4,509,209 | 4/1985 | Itoh et al. . | |
| 4,569,573 | 2/1986 | Agostinelli | 29/825 |
| 4,748,495 | 5/1988 | Kucharek | 257/738 X |
| 4,885,592 | 12/1989 | Kofol et al. . | |
| 5,068,669 | 11/1991 | Koert et al. . | |
| 5,068,670 | 11/1991 | Maoz . | |

FOREIGN PATENT DOCUMENTS

| | | |
|---|---|---|
| 0432647 | 6/1991 | European Pat. Off. . |
| 62-144355 | 6/1987 | Japan . |
| 62-242337 | 10/1987 | Japan . |
| 63-147318 | 7/1988 | Japan . |

OTHER PUBLICATIONS

Austin et al., Design Concepts For Active Phased Modules, IEE Proc. F., vol. 127, No. 4, Aug., 1980, pp. 290–300.

J. F. McIlvenna, Monloithic Phased Arrays For EHF Communications Terminals, Microwave Journal, Mar., 1988, pp. 113–125.

*Primary Examiner*—Carl J. Arbes

[57] ABSTRACT

A monolithic gallium arsenide (GaAs) phased array using integrated gold (Au) posts for interconnecting multiple substrate layers. The phased array includes a GaAs substrate having transmit/receive modules fabricated on one side and radiating elements etched on the backside of the same substrate. The conductive gold posts are integrated on the same side with the transmit/-receive modules and interconnect the transmit/receive modules with a distribution network which is printed on a second substrate. Gold posts are also used to interconnect DC bias and control lines of the two substrates.

1 Claim, 5 Drawing Sheets

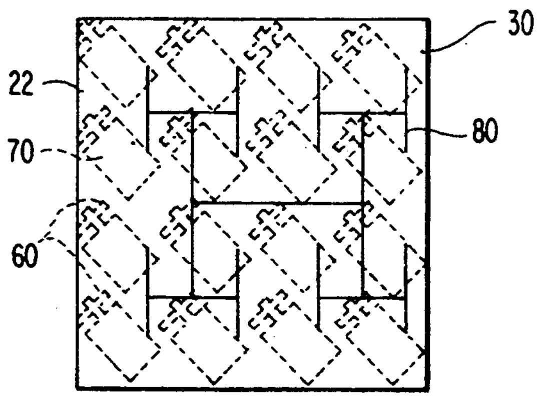
FIG. 1A
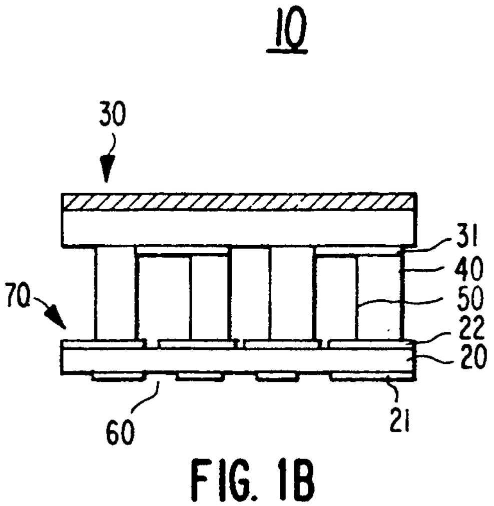
FIG. 1B
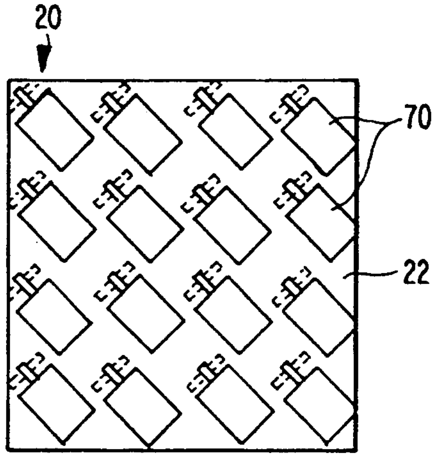
FIG. 2A
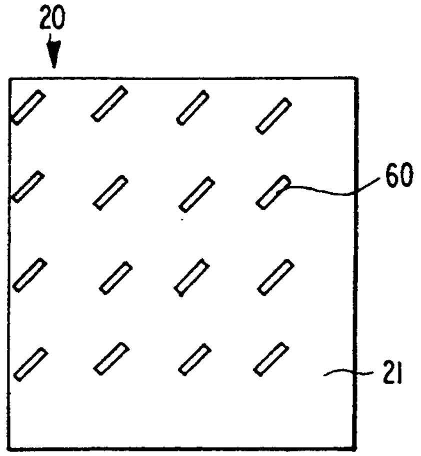
FIG. 2B
FIG. 3A
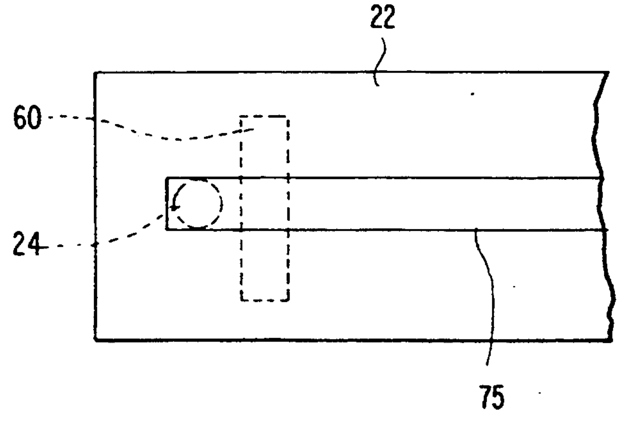
FIG. 3B
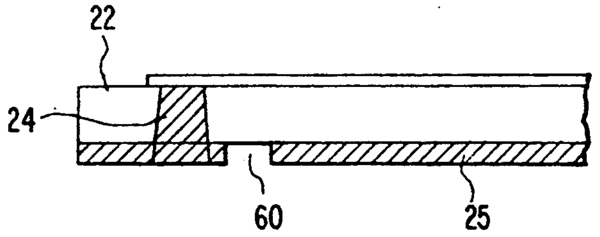

FIG. 7B
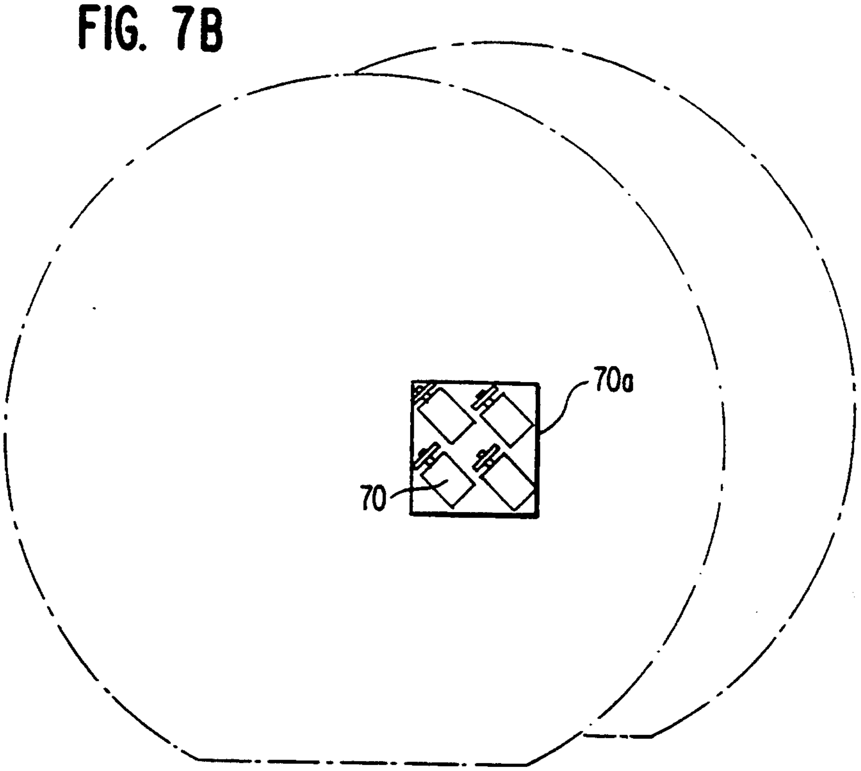
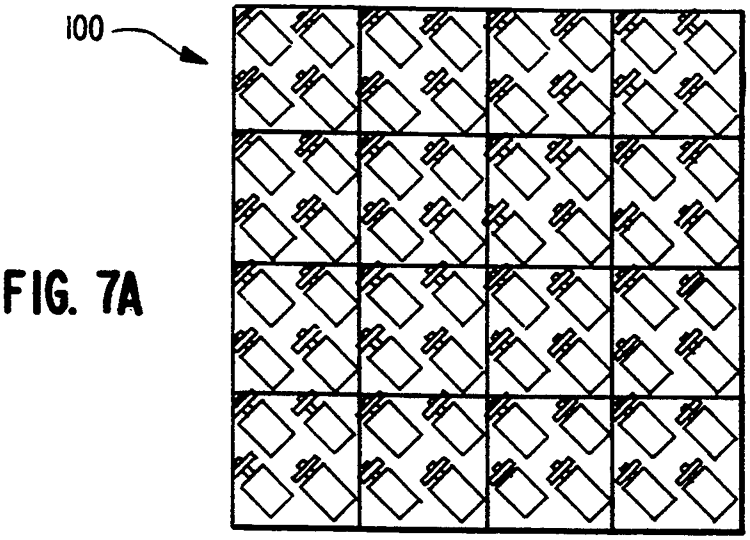
FIG. 7A

METHOD OF ASSEMBLING A MONOLITHIC GALLIUM ARSENIDE PHASED ARRAY USING INTEGRATED GOLD POST INTERCONNECTS

This is a divisional of application Ser. No. 07/732,269 filed Jul. 18, 1991, now U.S. Pat. No. 5,262,794.

BACKGROUND OF THE INVENTION

The present invention relates, in general, to a phased array and more particularly to a monolithic gallium arsenide (GaAs) phased array having gold (Au) post interconnects for interconnecting multiple layers of the phased array.

Phased arrays have numerous applications in military systems such as smart munitions and multi-mission surveillance radars. An efficient phased array system must perform real-time scanning for target detection, identification, tracking, covert communication and threat warning from all directions, and at the same time it must conform to the vehicle to minimize the radar cross section. Hence, a very thin, low-cost phased array system is a desirable solution to the problem of a conformal array integrated into the vehicle's skin. The array's required almost panoramic field of vision sets constraints on the element-to-element spacing and, often, the distribution network and control circuitry must be built on a layer different from the transmit/receive module (herein referred to as T/R module) layer.

One of the most challenging problems in the assembly of such an array is the layer-to-layer interconnections that need to be made to connect processing circuitry and distribution network lines to the active T/R modules that are, in turn, coupled to the radiating elements. Other difficulties include the support structures that separate the different layers, and the coolant passages for excess heat removal.

Existing methods of interconnecting different layers include microcoaxial lines for the RF connections and ceramic walls with perimeter interconnects for the DC and control connections. Fiber optical cables have also been considered. The above methods, however, are very tedious and expensive to implement, and therefore disadvantageous.

Another existing approach that avoids multi-layer interconnections is the "stacked motherboard" approach which utilizes one motherboard of a dielectric material on which all the necessary distribution network, DC bias and control lines are printed, with the T/R module chips placed on the motherboard. The complete array is then formed by stacking several of these motherboards in shelves. This approach, however, is disadvantageous because it suffers from having a considerably thicker size than the multi-layer approach, and its hybrid assembly is very expensive and time-consuming.

SUMMARY OF THE INVENTION

Accordingly, it is a general object of the present invention to provide a completely monolithic and planar phased array, which makes use of the newly developed technology of layer-to-layer interconnection through conductive posts that are integrated on the same gallium arsenide (GaAs) wafer that carries transmit/receive modules and which is free of the above-mentioned problems and disadvantages.

It is also an object of the present invention to provide a monolithic phased array wherein the production cost and size of the array will be far less than any of the existing hybrid approaches because of its monolithic nature.

In accordance with the above and other objects, the present invention provides a monolithic phased array including a first substrate having fabricated on a first side a plurality of circuits and having etched on a second side a plurality of radiating elements, the plurality of circuits each having at least two RF input/output lines, DC bias lines and control lines, a second substrate having etched on a first side a distribution network and DC bias lines and control lines, first connecting means integrally fabricated on the first side of the first substrate for connecting for each of the plurality of circuits at least one of the two RF input/output lines to the distribution network, second connecting means integrally fabricated on the first side of the first substrate for connecting for each of the plurality of circuits the DC bias lines and control lines to the DC bias lines and control lines of the second substrate, and means for electromagnetically coupling for each of the plurality of circuits at least one of the two RF input/output lines to a corresponding one of the radiating elements.

Further in accordance with the above objects, the present invention provides a monolithic phased array having at least a first and second layer, wherein the first layer has monolithic circuits fabricated on a first side whose first set of inputs/outputs are electromagnetically coupled to radiating elements etched on a second side of the first substrate, the second layer has at least a distribution network and other signal paths etched on a first side. The monolithic phased array further includes gold posts integrally formed on the first side of the first layer for connecting a second set of inputs/outputs of the monolithic circuits to the distribution network and for connecting the other signal paths to corresponding other signal paths of the first layer.

Yet further, the invention provides a monolithic phased array which includes a first layer having on a first side thereof at least one sub-array of circuits fabricated from at least one wafer and mounted on a supporting structure to form a larger array of circuits and an array of radiating elements corresponding to the larger array of circuits formed on a second side of the first layer, each one of the radiating elements being respectively electromagnetically coupled to an input/output means of each circuit of the larger array of circuits, a second layer having etched on a first side a distribution network and DC bias lines and control lines, and connecting means integrally fabricated in each of the circuits for electrically connecting the first layer to the second layer.

Still further, the invention provides a method of assembling a monolithic phased array of the type having a n×m array of radiating elements and at least a first layer electrically connected to the second layer, the method including the steps of: fabricating a plurality of T/R modules from at least one wafer, each of the plurality of T/R modules having integrated thereon a plurality of gold posts for interconnecting the first layer to the second layer, placing a predetermined amount of solder reform on each tip of the plurality of gold posts during the fabrication of the T/R modules, testing the plurality of T/R module wafers according to a set of predetermined criteria and identifying each T/R module that is functional, selecting from at least one wafer sub-arrays of the functional T/R modules, fabricating a metallic tray having a set of precision alignment marks and a plurality of slits forming a n×m array corresponding to the n×m array of radiating elements, populating the metallic tray with the sub-arrays of the functional T/R modules such that the sub-arrays of T/R modules are mounted on the metallic tray in alignment with the precision alignment marks on the metallic tray, the populated metallic tray constituting the first layer, placing a distribution network substrate which constitutes the second layer on the first layer, heating the thus assembled phased array to the melting point of the solder reform disposed on the gold posts, and cooling the thus heated assembled phased array causing the second layer to be electrically connected to the first layer thereby forming the monolithic phased array.

The above and other objects, features, and advantages of the present invention will become more apparent from the following detailed description taken in conjunction with the accompanying drawings.

BRIEF DESCRIPTION OF THE DRAWINGS

FIGS. 1A and 1B respectively show a top and a side view of a phased array constructed in accordance with the invention.

FIGS. 2 and 2B respectively show a top and a bottom view of the bottom substrate of FIG. 1B.

FIGS. 3A and 3B respectively illustrate electromagnetic coupling between input/outputs of one transmit/receive module from a top and a side view of the bottom substrate of FIG. 1B.

FIGS. 7A and 7B respectively show a transmit/receive module GaAs wafer and a sub-array of transmit/receive modules.

DESCRIPTION OF THE PREFERRED EMBODIMENTS

Figure 4:
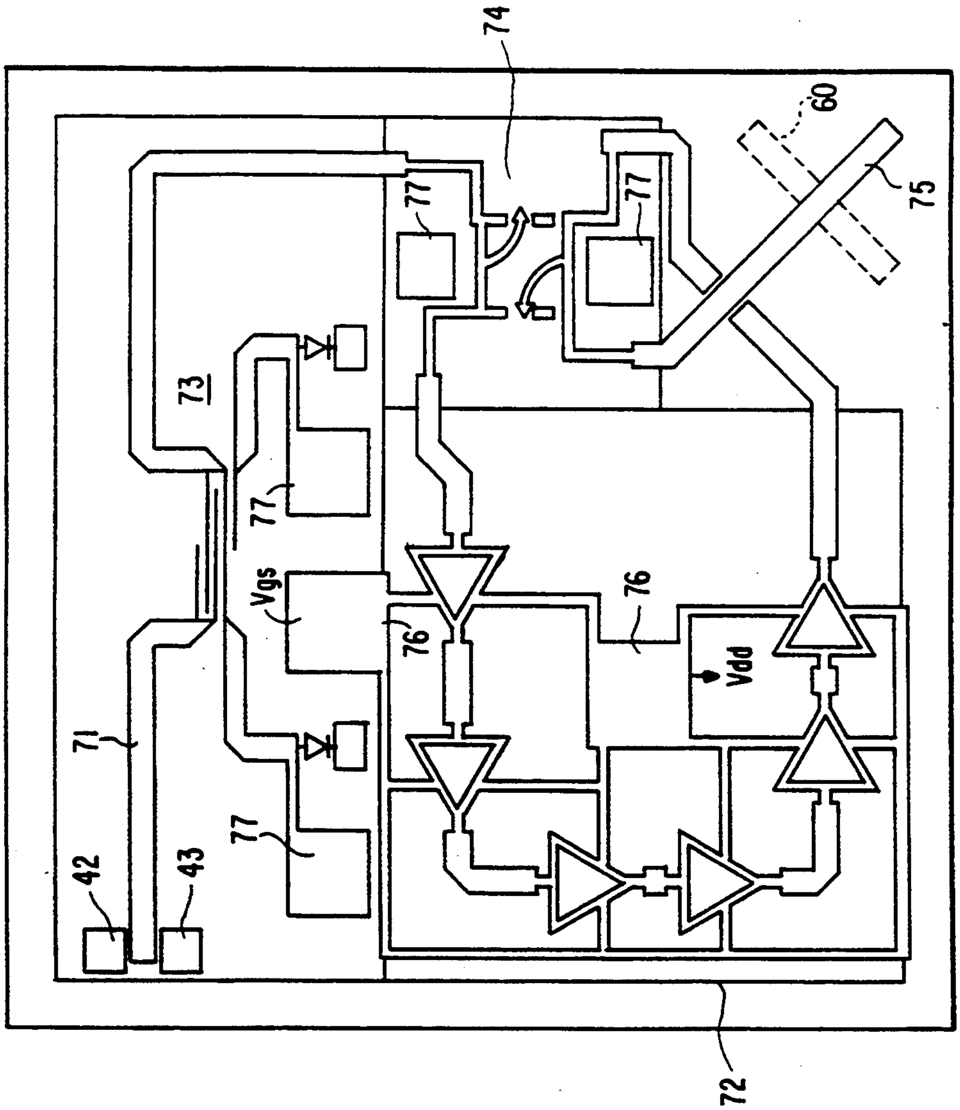
FIG. 4 shows a circuit diagram of a monolithic transmit/receive module circuit of the invention.

Referring to FIG. 1B, there is shown a monolithic gallium arsenide (GaAs) phased array 10 according to the present invention. The phased array 10 includes two parallel layers; a first substrate 20, which constitutes the first layer, is made of GaAs, and a second substrate 30, which constitutes the second layer, is preferably composed of any low-loss dielectric material such as fused silica. The second substrate may also be composed of silicon, which would then permit digital circuitry to be monolithically integrated thereon. Gold (Au) posts, such as an RF connection post 40 and a DC/control connection post 50, are integrally fabricated on the GaAs substrate 20 and are used to interconnect the two substrates 20 and 30.

FIGS. 2A and 2B respectively show a top side 22 and a bottom side 21 of the GaAs substrate 20. An array of transmit/receive circuit modules 70 (herein referred to as T/R modules), which are shown in more detail in FIG. 4, are monolithically fabricated on the top side 22 of the GaAs substrate 20.

The T/R module 70 constitutes one amplifier chain which can operate either as a transmitter or receiver depending upon applied control signals. The T/R module includes a microstrip line 71, which may be configured as either an input or output and is electrically connected to a point on the distribution network 80, a low-noise amplifier 72, a phase shifter 73, a transfer switch 74, and a second microstrip line 75, which also may be configured as either an input or output and is electromagnetically coupled to a radiating element 60.

When a T/R module operates as a transmitter (i.e., signals are radiated from the phased array via the radiating elements), the microstrip line 71 is configured as an input to the T/R module for receiving signals from the distribution network 80. The microstrip line 75 is configured as an output of the T/R module for outputting signals to a radiating element 60. On the other hand, when the T/R module operates as a receiver (i.e., the radiating elements are receiving signals), the microstrip line 71 is configured as an output for outputting to the distribution network signals received via the radiating element and T/R module. The microstrip line 75 is configured as an input for inputting to the T/R module, signals received from the radiating elements. For the sake of clarity, the following description will assume that the T/R module is configured as a transmitter and, therefore, reference will be made to the microstrip line 71 as an input and to the microstrip line 75 as an output.

With further reference to FIG. 4, an output of the phase shifter 73 is connected to the transfer switch 74 which, when in a first position, directs the output of the phase shifter 73 first to the low-noise amplifier 72 and then to the radiating element 60 via the microstrip line output 75. On the other hand, when the transfer switch is in a second position (i.e., configuring the phased array as a receiver), the received signal from the radiating element 60 is directed to the distribution network 80 via the low-noise amplifier 72 and the phase shifter 73. The phase shifter 73 of each T/R module provides variable phase, which is controlled by applied control signals, to electronically steer the phased array beam by varying the phases of the different T/R modules in the phased array.

In certain applications, the above-described low-noise, single amplifier chain can be utilized because it can provide sufficient power for that specific application. However, in applications where more power is needed than what the low-noise, single amplifier chain can provide, two amplifier chains can be used in conjunction with two double-pole double-throw switches. In this case, one chain is the power amplifier for the transmitter and the second chain is the low-noise amplifier for the receiver.

The radiating elements 60, being in this case rectangular slot antennas, are etched on the bottom side 21 of the GaAs substrate 20. In general, there is one slot antenna for each T/R module 70 as illustrated in FIGS. 1A and 2A. The microstrip line 75 of each T/R module 70 is electromagnetically coupled to a corresponding radiating element 60 as shown in detail in FIGS. 3A and 3B. Specifically, on the top side 22 of the GaAs substrate 20, the microstrip line 75 is connected to a plated via hole 24 that is connected to a ground plane 25 located on the bottom side 21 of the GaAs substrate 20.

Figure 5A:
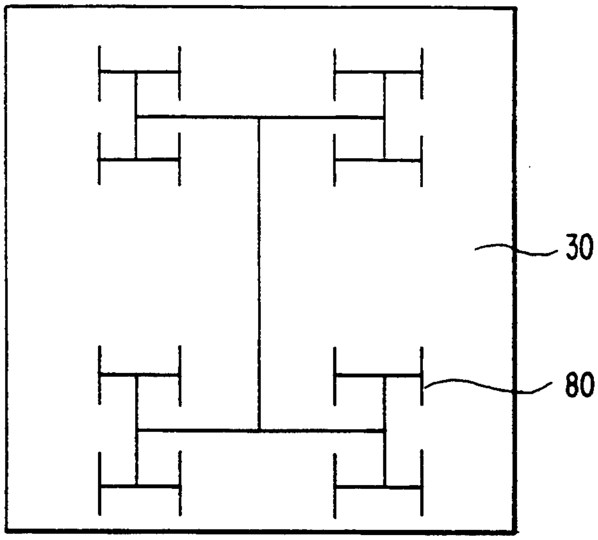
FIGS. 5A and 5B show a distribution network located on the top substrate of FIG. 1B and FIG. 5B further illustrates a DC bias and control signal paths.
Figure 5B:
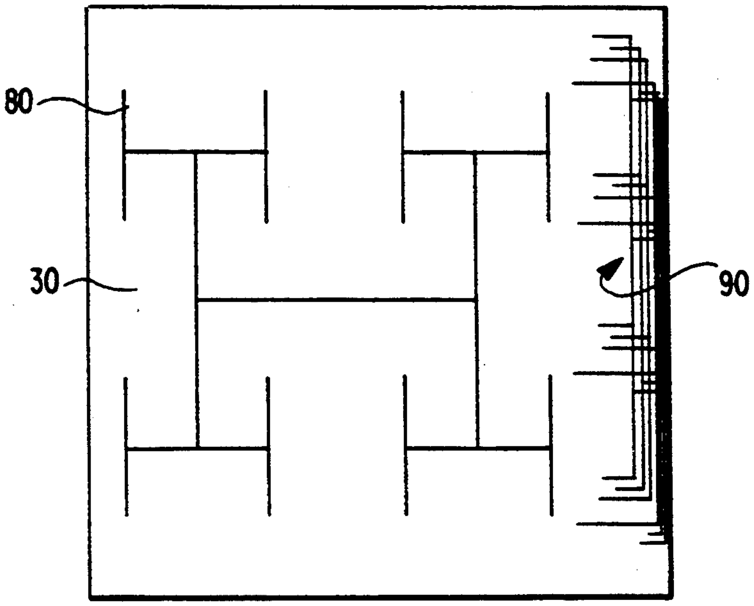

The second substrate 30 includes a distribution network 80 and various DC and control lines 90 etched on one side of the substrate 30 and a ground plane 35 located on a second side thereof. The distribution network 80, as shown in FIG. 5A, is a branching arrangement of microstrip lines or other transmission lines which allows the distribution of one signal source (such as the input signal to the phased array) to multiple branches.

Referring now back to FIG. 1B, there is shown a top perspective view of the phased array illustrating the alignment of the distribution network 80, T/R modules 70, and slot antennas 60. The DC lines provide DC bias $V_{gs}$ and $V_{dd}$ (see FIG. 4) to the T/R modules, and the control lines provide control signals, such as a transfer switch control signal and a phase shifter control signal, to the T/R modules.

Figure 6:
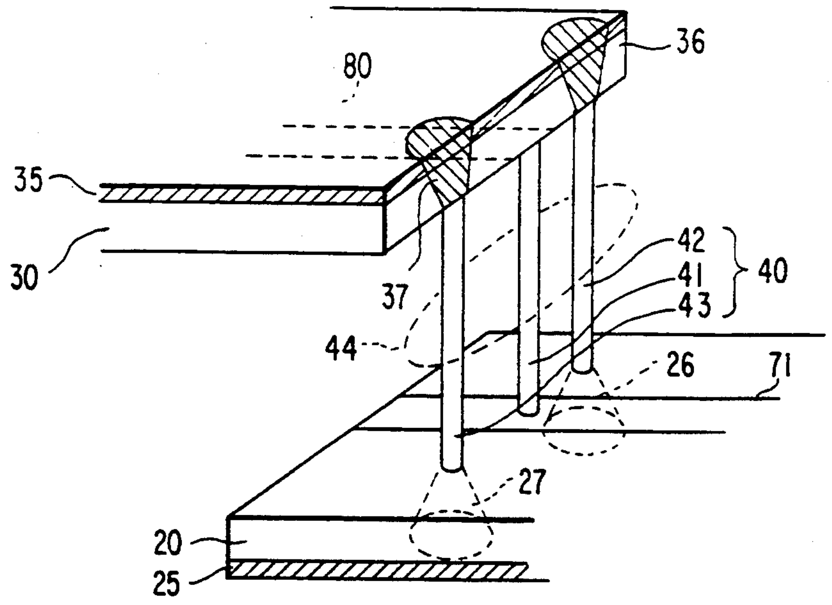
FIG. 6 shows a side view of the phased array of the invention illustrating RF connection posts.

The interconnect gold posts 40 and 50, are integrated with the T/R modules on the GaAs substrate 20 and are fabricated during the processing of the T/R module GaAs wafer. With reference to FIG. 6, the interconnect gold posts include the RF connection post 40 and the DC/control connection post 50. More specifically, the posts 40 are RF connection posts used to interconnect the distribution network 80 to the microstrip lines 71 of the T/R modules 70, and the posts 50 are DC/control connection posts used to respectively connect the DC bias lines and control lines 90 of the second substrate 30 to the T/R modules' DC bias pads 76 and control pads 77.

Each RF connection post 40 includes three conductive gold posts 41, 42, and 43 to make the RF signal connection between the GaAs substrate 20 and the second substrate 30, as illustrated in FIG. 6. The first gold post 41 connects a point 81 on the distribution network 80 to the microstrip line 71 of a T/R module. The two gold posts 42 and 43 connect the ground planes 25 and 35 of the two substrates 20 and 30. Specifically, the gold post 42 is connected through a plated via hole 36 which is connected to the ground plane 35. The other end of the same gold post 42 is connected through a plated via hole 26 to the ground plane 25. Similarly, the third gold post 43 is connected through a plated via hole 37 which is connected to the ground plane 35. The other end of the gold post 43 is connected through a plated via hole 27 which is connected to the ground plane 25. The spacing between the three gold posts 41, 42, and 43 is such that the discontinuity is minimized by maintaining a 50-ohm impedance transmission line along the resulting vertical transmission line system, generally designated by reference numeral 44.

The DC bias lines and control lines 90 are connected in a similar manner through conductive gold posts. However, unlike the RF connection, only one post is necessary to make each connection.

The GaAs phased array can be of various size depending generally upon the application in which the phased array is used. The size of the phased array can be expressed in terms of the number of T/R modules that are integrated into a phased array. Specifically, the phased array includes an $n \times m$ array of T/R modules, for example, a $2 \times 2$, $8 \times 8$, or $3 \times 4$ array of T/R modules.

The assembly of a phased array may or may not be constructed from a single GaAs wafer of T/R modules, depending on both the array size and yield of the T/R module fabrication process. That is, the process of assembling a phased array is modular in the sense that multiple smaller arrays (or sub-arrays) of T/R modules may be integrated together to form the larger $n \times m$ phased array. For example, FIG. 7A shows an $8 \times 8$ phased array with 16 T/R module sub-arrays eutectically mounted on a metallic tray 100 (as will be further described below). Each sub-array has four T/R modules arranged in a $2 \times 2$ sub-array 70*a*, collectively arranged to form the $8 \times 8$ array of T/R modules (or phased array).

In situations where the yield of the T/R modules is relatively high (e.g., greater than 90%), and the $n \times m$ array size of the phased array is relatively small, the phased array could, perhaps, be integrated from a single T/R module GaAs wafer. However, this assumes that on the single GaAs wafer, there is a contiguous $n \times m$ array of functional T/R modules.

On the other hand, when a phased array is not capable of being constructed from a single GaAs wafer, sub-arrays 70*a* from multiple wafers are integrated together. For example, referring to the above $8 \times 8$ phased array, where 16 T/R module sub-arrays 70*a* are integrated to form the completed phased array, each of the 16 sub-arrays 70*a* could potentially have been from a separate GaAs wafer.

Figure 8:
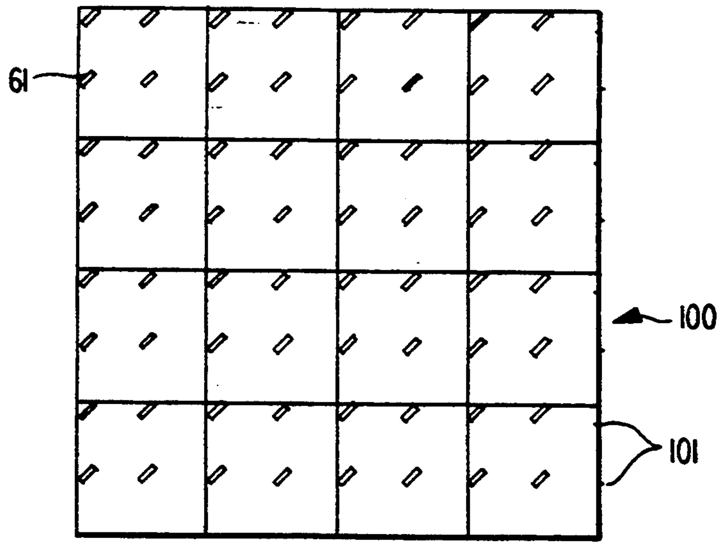
FIG. 8 shows metallic tray used as a supporting structure and heat sink for the phased array.
Figure 9:
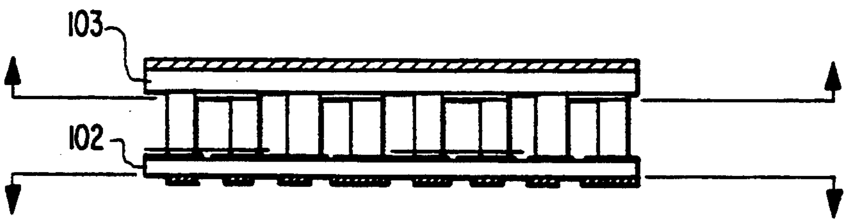
FIG. 9 shows first and second layers of the phased array mounted on one another.

The assembly of a phased array will now be described. A metallic tray 100, as shown in FIG. 8, is populated with at least one T/R modules GaAs wafer or several, again depending upon the phased array size and yield. Regardless of the number of T/R module GaAs wafers, however, each wafer is eutectically mounted on the metallic tray in precise alignment with precision alignment marks 101 which are located on the metallic tray 100. The T/R module wafers may also be mounted on the tray using epoxy as opposed to solder, but because of thermal considerations, solder is preferred. The second layer 103 (i.e., the distribution network and DC and control substrate) is then aligned and placed on top of the first layer 102 (i.e., the tray including the T/R modules) such that the gold posts contact the pads on the second layer (FIG. 9). The entire structure is then heated to the melting point of the solder reform that was placed on the post tips during the GaAs wafer fabrication. The structure is then cooled causing the gold post to be electrically connected to both the distribution network and DC bias/control pads.

In addition to providing a supporting structure, the metallic tray also acts as a heat sink. Accordingly, using any one of several well-known methods such as forced air, liquid, fins, etc., the heat sink (i.e., metallic tray) can be cooled.

There has thus been shown and described a novel phased array architecture relating specifically to a monolithic GaAs phased array having gold (Au) post interconnects for interconnecting multiple layers of the phased array which fulfills all the objects and advantages sought therefor. Many changes, modifications, variations, and other uses and applications of the subject invention will, however, become apparent to those skilled in the art after considering the specification and the accompanying drawings which disclose preferred embodiments thereof. All such changes, modifications, variations, and other uses and applications which do not depart from the spirit and scope of the invention are deemed to be covered by the invention which is limited only by the claims which follow.

What is claimed is:

1. A method of assembling a monolithic phased array of the type having a $n \times m$ array of radiating elements and at least a first layer electrically connected to a second layer, said method comprising the steps of:

a. fabricating a plurality of T/R modules from at least one wafer, each of said plurality of T/R modules having integrated thereon a plurality of gold posts for interconnecting said first layer to said second layer;

b. placing a predetermined amount of solder reform on each tip of said plurality of gold posts during said fabrication of said plurality of T/R modules;

c. testing said plurality of T/R module wafers according to a set of predetermined criteria and identifying each T/R module that is functional;

d. selecting from said at least one wafer sub-arrays of said functional T/R modules;

e. fabricating a metallic tray having a set of precision alignment marks and a plurality of slits forming a n×m array corresponding to said n×m array of radiating elements;

f. populating said metallic tray with said sub-arrays of said functional T/R modules such that said sub-arrays of T/R modules are mounted on said metallic tray in alignment with said precision alignment marks on said metallic tray, said populated metallic tray constituting said first layer;

g. placing a distribution network substrate which constitutes said second layer on said first layer;

h. heating the thus assembled phased array to the melting point of said solder reform disposed on said gold posts; and i. cooling the thus heated assembled phased array causing said second layer to be electrically connected to said first layer thereby forming said monolithic phased array.

* * * * *